(12) United States Patent
Murakoshi et al.

(10) Patent No.: US 8,162,508 B2
(45) Date of Patent: Apr. 24, 2012

(54) LED SUBSTRATE AND LED LIGHT SOURCE DEVICE

(75) Inventors: Kenichi Murakoshi, Osaka (JP); Hiroyuki Nabesawa, Osaka (JP); Atsushi Yamashita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 290 days.

(21) Appl. No.: 12/715,706

(22) Filed: Mar. 2, 2010

(65) Prior Publication Data

US 2010/0226136 A1    Sep. 9, 2010

(30) Foreign Application Priority Data

Mar. 3, 2009    (JP) .................................. 2009-048827

(51) Int. Cl.
*F21V 21/00*    (2006.01)

(52) U.S. Cl. .................. 362/249.02; 362/97.1

(58) Field of Classification Search .................. 362/97.1, 362/97.2, 97.3, 227, 133, 545, 249.01, 249.02, 362/646

See application file for complete search history.

(56) References Cited

U.S. PATENT DOCUMENTS

| | | | | |
|---|---|---|---|---|
| 7,566,147 B2 * | 7/2009 | Wilcox et al. | ............ | 362/249.02 |
| 7,794,115 B2 * | 9/2010 | Hellinger et al. | ............. | 362/294 |
| 7,837,353 B2 * | 11/2010 | Mo et al. | .................. | 362/249.02 |
| 7,837,354 B2 * | 11/2010 | Mo et al. | .................. | 362/249.02 |
| 7,914,162 B1 * | 3/2011 | Huang | ............................. | 362/92 |
| 7,926,985 B2 * | 4/2011 | Teng et al. | ..................... | 362/373 |
| 7,976,210 B2 * | 7/2011 | Shinozaki | ..................... | 362/631 |
| 2008/0143916 A1 | 6/2008 | Fujino et al. | | |

FOREIGN PATENT DOCUMENTS

| | | |
|---|---|---|
| JP | 4-123840 U | 11/1992 |
| JP | 2004-265724 A | 9/2004 |
| JP | 3128244 | 12/2006 |
| JP | 2008-28171 | 2/2008 |

* cited by examiner

*Primary Examiner* — Thomas Sember
(74) *Attorney, Agent, or Firm* — Nixon & Vanderhye P.C.

(57) ABSTRACT

An LED substrate comprises holes having an elliptical shape through which fixing screws are inserted. The fixing screw has a head portion, an unthreaded neck portion whose diameter smaller than that of the head portion, and a threaded shaft portion whose diameter smaller than that of the neck portion. A major axis of the hole is larger than the diameter of the head portion, and a minor axis thereof is smaller than the diameter of the head portion and larger than the diameter of the neck portion. The LED substrate further comprises counterbored recesses to which anchoring claws provided in a cabinet are fitted. A width of the counterbored recess in a direction of the major axis of the hole is larger than that of the anchoring claw. The counterbored recesses are formed on both of two sides of the LED substrate facing each other in a first direction.

4 Claims, 13 Drawing Sheets

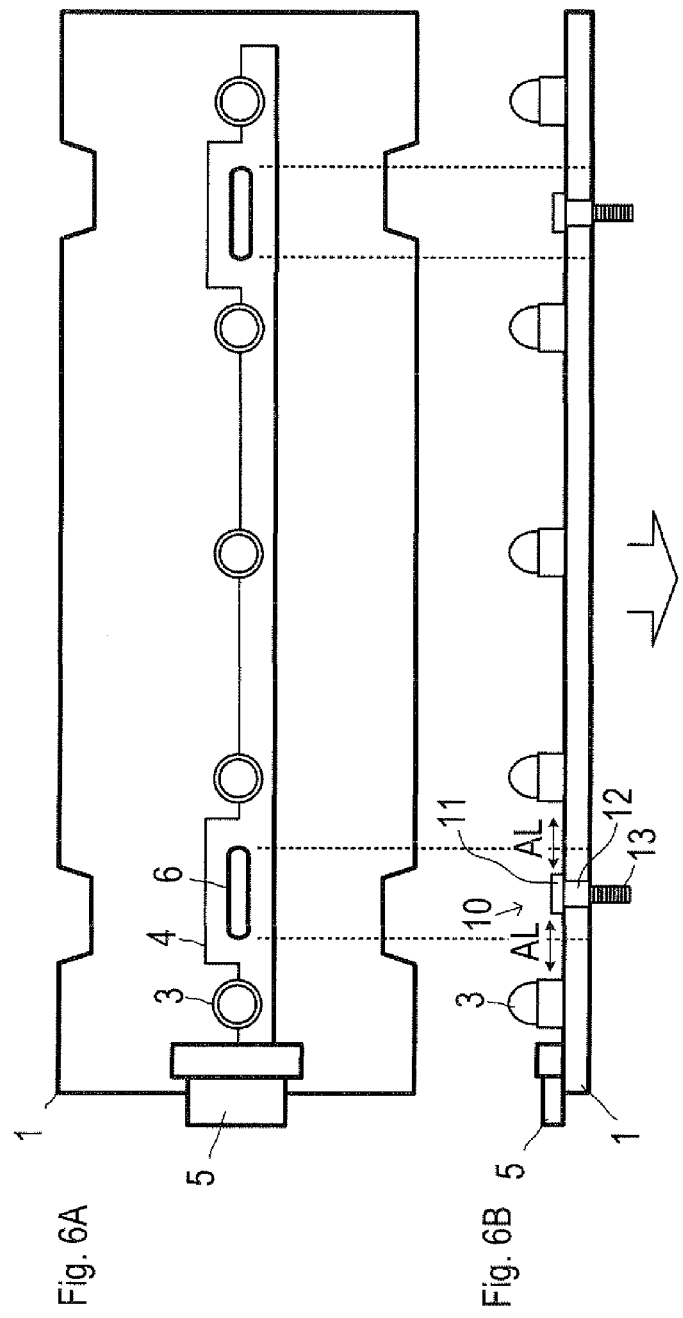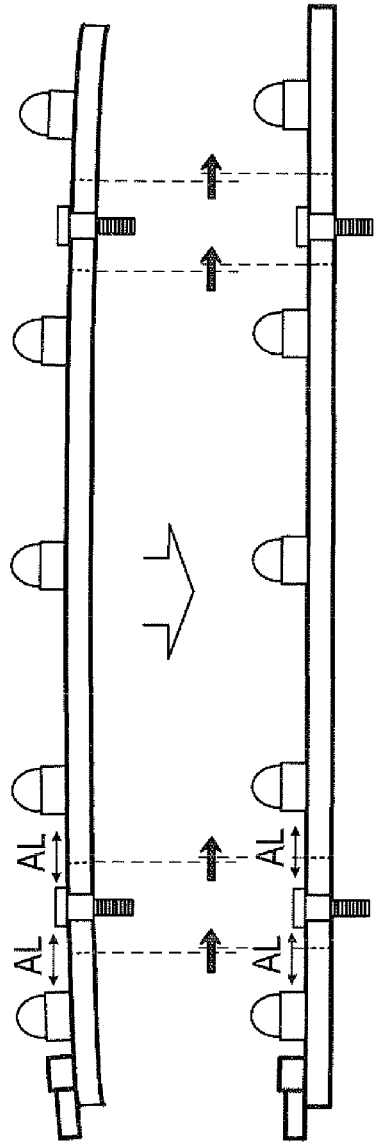

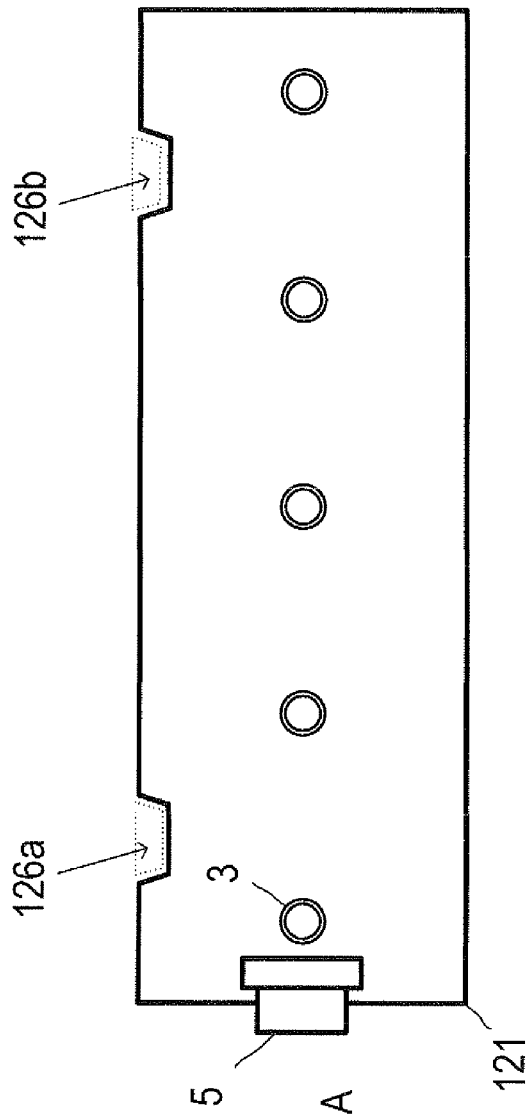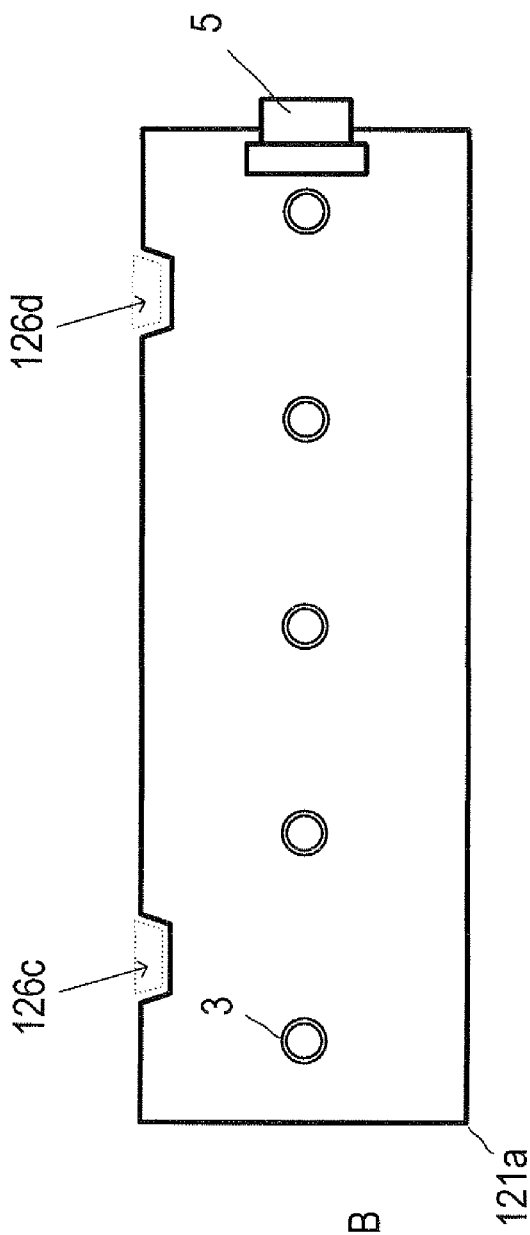

LED SUBSTRATE AND LED LIGHT SOURCE DEVICE

CROSS REFERENCE TO RELATED APPLICATION

This Nonprovisional application claims priority under 35 U.S.C. §119(a) on Patent Application No. 2009-048827 filed in Japan on 3 Mar. 2009 the entire contents of which are hereby incorporated by reference.

BACKGROUND OF THE INVENTION

1. Field of the Invention

The present invention relates to an LED substrate and an LED light source device comprising the LED substrate.

2. Description of the Related Art

A liquid crystal display device, wherein liquid crystal per se does not emit light, is provided with a backlight unit functioning as a light source, for example, on a rear section of a liquid crystal panel.

The backlight unit comprises such structural components as a primary light source, a light guide plate, a reflective film, and a lens sheet or a diffuser film, thereby irradiating a display light on a whole surface of the liquid crystal panel.

A conventional example of the backlight unit is a cold cathode fluorescent lamp in which mercury or xenon is sealed in a fluorescent tube as a primary light source. The cold cathode fluorescent lamp, however, had a few problems; inadequate light emission luminance, deterioration of a uniformity ratio due to a low-emission region on the cathode side and short lifetime.

With these conventional technical problems as a driving force, a surface mounting LED having such technical advantages as a high luminance, a long lifetime and a remarkable uniformity ratio is recently widespread as a backlight or a light source of a surface mounting switch.

An LED backlight device comprises a plurality of LED elements aligned in an array or matrix shape. Describing a specific example, a plurality of LED elements mounted on an LED substrate in a direction constitute a light emission unit, and a plurality of the light emission units aligned in a matrix shape constitute an LED backlight device.

The following prior art documents disclose a conventional LED substrate or an LED module (Utility Model Registration No. 3128244, 2008-28171 of the Japanese Patent Application Laid-Open; hereinafter, respectively referred to as Cited Document 1 and Cited Document 2).

FIG. 7 is an illustration of the LED substrate and a method for anchoring the LED substrate recited in the Cited Document 1. A plurality of LED elements 3 are amounted on an LED substrate 101, and tapped holes 102 through which screws are to be inserted are respectively provided in protruding portions 103 of the LED substrate 101 formed in the form of ear on both sides thereof.

When the LED substrate 101 is mounted in a metal cabinet 110, positions of tapped holes 106 in the cabinet 110 and positions of the tapped holes 102 on the substrate 101 are suitably adjusted, and fixing screws 105 are inserted through these holes to be screw-fastened so that the substrate is fixed to the metal cabinet 110. The LED elements 3 are placed so that they are located on through holes 108 in the cabinet 110.

FIG. 8 is a schematic illustration of the fixing screw 105, the tapped hole 106, and a state where the screw 105 is inserted through the tapped hole 106. FIG. 8A is a perspective drawing, and FIG. 8B is a planar drawing in top view.

As illustrated in FIG. 8A, the fixing screw 105 comprises a head portion 111 and a shaft portion 112, and the shaft portion 112 is threaded.

The head portion 111 and the shaft portion 112 both have a cylindrical shape. As illustrated in FIG. 8B, a diameter u3 of the head portion 111 is larger than a diameter u1 of the shaft portion 112. The tapped hole 106 is a through hole having a circular shape in top view. A diameter u2 of the tapped hole 106 is larger than the diameter u1 of the shaft portion 112 and smaller than the diameter u3 of the head portion 111. Practically, u2 has a dimension smaller than and substantially equal to u3.

FIG. 9 is an illustration of a state where the fixing screw 105 is inserted through the tapped hole 102. FIG. 9A shows the state in top view, and FIGS. 9B and 9C show the state in front view.

The LED element 3 is used in, for example, a liquid crystal display device, and the number of the LED elements to be used is on the increase along with the development of a larger liquid crystal panel in recent years. The LED element 3 generates heat when emitting light, and an amount of heat generation inevitably increases with more elements.

In the liquid crystal display device, wherein an enclosed space is formed on the rear side of the liquid crystal panel, heat generated by the LED element stays within the enclosed space, which heats up the liquid crystal device to high temperatures. Further, the heat may cause thermal expansion of the LED substrate 101.

As described earlier, the LED substrate 101 is fixed to the cabinet 110 by the fixing screws 105. In the LED substrate 101 thermally expanded, therefore, any screw-fastened sections are immovable, while otherwise sections are possibly warped as illustrated in FIG. 9C, resulting in the deformation of the substrate 101 in an arch shape.

Accordingly, an intense stress f1 is applied to vicinity of the sections fixed by the screws 105, and cracks may be generated in the substrate 101 or wiring routed in the LED element 3 may be broken in some cases. The wiring breakage disables light emission of the LED element 3 connected to the broken wiring, and the liquid crystal display device thereby lacks uniformity in its luminance.

FIG. 10 is an illustration of the LED substrate recited in the Cited Document 2. An LED substrate 121 comprises five LED elements 3 coaxially provided. These LED elements are connected to one another in series by a wiring 4, and also electrically connected to a power source 7 and an LED driver 8 by way of a substrate connector 5.

The liquid crystal display device, if provided with a plurality of LED elements respectively having different amounts of emission, undergoes luminance non-uniformity. The LED element is characterized in emitting a quantity of light corresponding to a current volume when a voltage applied thereto exceeds a predetermined voltage (forward drop voltage Vf). Therefore, a conventional method for equalizing the quantities of emission of the LED elements is to serially connect the plurality of LED elements as illustrated in FIG. 10 so that a constant amount of current flows in the respective LED elements.

In FIG. 10, an anode of the first LED element 3 is connected to an node Na from a power source 7 by way of the substrate connector 5, and a cathode thereof is connected to an anode of the LED element adjacent thereto. In any LED elements subsequent thereto, cathodes of the previous LED elements are connected to anodes, and anodes of the subsequent LED elements are connected to cathodes. A cathode of the last LED element 3 is connected to a node Nk from the LED driver 8 by way of the substrate connector 5. In FIG. 10, "A" denotes anode, and "K" denotes cathode.

Reference symbols 126a and 126b illustrated in FIG. 10 denote cutout portions (counterbored recesses) into which claws provided in the cabinet are to be fitted for securing the substrate to the cabinet.

To drive one LED substrate 121 having the structure illustrated in FIG. 10, a voltage at least five times as large as the forward drop voltage Vf should be applied to the node Na by the power source 7. An element for low-current drive in the LED driver 8 is connected to the node Nk to draw in a constant current so that the constant current flows in the LED elements 3. As a result, the LED elements 3 emit substantially equal quantities of light, respectively.

As mentioned earlier, increasing dimensions of the liquid crystal panel in recent years demand more LED elements 3. In the case where the LED elements are connected in series to stabilize the luminance, the voltage to be applied by the power source 7 is higher as more elements are directly connected in series. A larger potential difference is generated between the nodes Na and Nk as the applied voltage is increasingly higher, and the substrate connector 5 may result in electrical breakdown. Then, it is no longer possible to supply the constant current to the LED elements, inviting an operation failure. In summary, there should be a limit to the number of the LED elements 3 that can be serially connected.

An alternative method to deal with the disadvantage is, for example, to divide the LED elements 3 serially connected and separately drive the divided LED elements 3 as illustrated in FIG. 11. In FIG. 11, LED substrates on which the LED elements 3 are mounted are divided into an M1 group on left and an M2 group on right facing the drawing. The LED elements 3 on the LED substrate 121 of the M1 group are driven by an LED control circuit 31, and the LED elements 3 on the LED substrate 121 of the M2 group are driven by an LED control circuit 32.

In the illustration of FIG. 11, a plurality of LED substrates 121 illustrated in FIG. 10 are set in the cabinet 130. The LED control circuits 31 and 32 illustrated in FIG. 11 respectively include the power source 7 and the LED driver 8 illustrated in FIG. 10.

In FIG. 10, the substrate connector 5 is provided at one place of the LED substrate 121. In FIG. 11, however, the substrate connected to the LED control circuit 31 (or 32) is provided with the substrate connectors 5 at two places thereof on right and left and thereby connected to the LED control circuit 31 (or 32) by way of one of the connectors and connected to another LED substrate adjacent thereto by way of the other connector.

According to the Cited Document 2, the LED substrate 121 is anchored to the cabinet 130 by anchoring claws 132. As illustrated in FIG. 10, the LED substrates 121 are each provided with the counterbored recesses 126a and 126b into which the anchoring claws 132 are to be fitted. After the anchoring claws 132 are securely fitted into these counterbored recesses, the LED substrate 121 can be immovably mounted on the cabinet 130. In the Cited Document 2, the counterbored recesses are formed at two positions on one side of the LED substrate 121 in a longitudinal direction.

To securely attach the LED substrate 121 to the cabinet 130, the anchoring claws 132 are preferably inserted into the LED substrate 121 through a lower section thereof and further upward in view of gravity. More specifically, in such a component placement in FIG. 11 that an upper side facing the drawing denotes an upward side and a lower side facing the drawing denotes a downward side, the LED substrate 121 and the anchoring claws 132 preferably have a positional relationship as with the M1 group on left facing the drawing.

In FIG. 11, the LED control circuits 31 and 32 are positioned so as to face each other with the LED substrates 121 interposed therebetween. Therefore, there are different positional relationships between the LED control circuits (31 and 32) and the LED substrates 121 respectively included in the M1 group and M2 group.

More specifically, in such a component placement that the upper side facing the drawing denotes the upward side and the lower side facing the drawing denotes the downward side as illustrated in FIG. 11, the anchoring claws 132 are inserted into the LED substrates 121 of the M2 group through upper sections thereof and further downward. As a result, the substrates are less stable than the substrates of the M1 group in view of gravity, possibly causing problems over time; the LED substrates 121 of the M2 group may be largely displaced from their predetermined positions or disengaged from the cabinet 130. These problems unfavorably lead to the luminance non-uniformity of the liquid crystal display device.

An approach for avoiding these problems is to similarly form the counterbored recesses of the LED substrates 121 in the M2 group so as to insert the anchoring claws 132 through the lower sections thereof and further upward. More specifically, two different LED substrates are prepared, wherein different positional relationships are respectively employed in the formation of the substrate connectors 5 and the counteredbored holes.

A more detailed description is given below. As illustrated in FIG. 12A, an LED substrate 121 is produced, wherein the substrate connector 5 is formed on one of short sides of the substrate, and the counterbored recesses 126a and 126b are formed on a long side adjacent clockwise to the short side where the substrate connector 5 is formed. Then, as illustrated in FIG. 12B, an LED substrate 121a is produced, wherein the substrate connector 5 is formed on one of short sides of the substrate, and the counterbored recesses 126c and 126d are formed on a long side adjacent anticlockwise to the short side where the substrate connector 5 is formed.

The substrate 121 illustrated in FIG. 12A is allocated to the M1 group, and the substrate 121a is allocated to the M2 group. According to the structure, the anchoring claws 132 can be inserted into the substrates of both groups through lower sections thereof and further upward as illustrated in FIG. 13. Then, these substrates can be both anchored to the cabinet 130 with more stability.

To accomplish the structure illustrated in FIG. 13, it is necessary to prepare the two different LED substrates as illustrated in FIG. 12. This technical solution, however, invites increase of development costs, for example, it is necessary to prepare a plurality of different metal molds for designing the substrates, and an initial designing cost is additionally necessary.

The structures illustrated in FIGS. 11 and 13 are still unable to avoid the thermal expansion of the substrates due to the heat generation by the LED elements 3 described earlier. The structures illustrated in FIGS. 11 and 13, wherein the substrates are anchored to the cabinet 130 by the anchoring claws 132 alone, includes a high probability of the deformation of the substrates due to thermal expansion, resulting in disengagement of the substrates from the cabinet 130.

A possible way to further increase the stability is to additionally employ the anchoring using screws as illustrated in FIG. 7 in the structure illustrated in FIG. 13. In that case, it is expected that the additional anchoring using the anchoring claws 132 serves to lessen the stress concentrated on vicinity of the screw-fastened sections as compared with FIG. 7. However, a measure of stress concentration is still inevitable notwithstanding the expectation, possibly leading to likelihood of the substrate warp. Moreover, the problem of production cost increase remains unsolved.

SUMMARY OF THE INVENTION

The present invention was carried out to solve the problems described so far, and a main object thereof is to provide an LED substrate capable of ensuring a high stability by preventing a substrate from warping due to heat generation by an LED element and still achieving reduction of manufacturing costs, and an LED light source device comprising the LED substrate.

In order to achieve the foregoing object, an LED substrate according to the present invention is an LED substrate having a rectangular shape on which an LED element is mounted, comprising:

counterbored recesses into which anchoring claws provided in a cabinet for supporting the LED substrate are to be fitted, the counterbored recesses being formed at predetermined positions on two sides of the LED substrate facing each other in a first direction;

holes through which fixing screws are to be inserted to secure the LED substrate to the cabinet, the holes each having a head portion, an unthreaded neck portion having a diameter smaller than a diameter of the head portion and a threaded shaft portion having a diameter smaller than the diameter of the neck portion; and a substrate connector provided at a predetermined position on at least one of two sides of the LED substrate in a second direction orthogonal to the first direction, the substrate connector connecting the LED substrate to a control circuit for the LED element or another LED substrate, wherein the holes each has an elliptical shape having a major axis larger than the diameter of the head portion and a minor axis smaller than the diameter of the head portion and larger than the diameter of the neck portion, widths of the counterbored recesses in a direction of the major axis of the holes are larger than those of the anchoring claws, and a thickness of the LED substrate is designed so that a boundary position between the neck portion and the head portion is located at a height position equal to a surface of the LED substrate when the fixing screws are inserted through the holes and fastened.

According to the LED substrate thus provided, wherein the major axis of the hole is larger than the diameter of the neck portion of the fixing screw, a "play" is still imparted to the hole in the major-axis direction after the LED substrate is fastened. In actual use, the threaded shaft portion is screwed into a screwing portion formed in the cabinet, therefore, the presence of the "play" does not undermine stability. Further, the minor axis of the hole is smaller than the diameter of the neck portion, and the substrate is designed to have such a thickness that the boundary position between the neck portion and the head portion is located at the height position equal to the substrate surface. Therefore, the stability is ensured by a contact between the substrate surface and the boundary position between the neck portion and the head position.

In the case where the LED substrate is thermally expanded due to heat generation by the LED element, the "play" allows movements of the substrate per se. This distinct structure can prevent the substrate from warping which often occurred in the conventional structures wherein the tapped holes were very tightly stuffed with the screws, and accordingly avoid stress concentration on vicinity of where the screws are used. As a result, unfavorable events such as possible cracks in the substrate and resulting wiring breakage can be prevented from happening.

According to the structure wherein the neck portion of the fixing screw is unthreaded, contact surfaces of the LED substrate and the fixing screw are subject to only a small friction. Therefore, the "play" allows smooth movements of the substrate in the case where the substrate is thermally expanded.

According to the structure wherein the fastening is supported by the two structural components, fixing screws and anchoring claws, the stability can be improved as compared with the conventional structures. Because the counterbored recess is formed so that its width in the direction of the major axis of the hole is larger than that of the anchoring claw, a "play" is imparted to the counterbored recess in the direction of the major axis of the hole as with the hole. Therefore, the anchoring claw does not obstruct the movements of the substrate, if thermally expanded, and the substrate can move depending on the "play". As a result, possible "warp" of the substrate can be avoided.

The counterbored recesses are respectively formed on the two sides facing each other in the first direction. Therefore, the anchoring claws can be inserted into the substrate through a lower section thereof and further upward irrespective of any positional relationship between the controller of the LED element and the substrate. This makes it unnecessary to produce different substrates depending on the positional relationship with the controller, thereby preventing manufacturing costs from increasing.

In the characteristic structure described so far, the direction of the major axis of the hole may be the second direction and a direction of the minor axis thereof may be the first direction, in which case the substrate moves in the second direction due to the thermal expansion.

An LED light source device according to the present invention is an LED light source device formed on the cabinet, comprising: a plurality of the control circuits including a first control circuit and a second control circuit; and at least one first LED substrate, at least one second LED substrate, at least one third LED substrate and at least one fourth LED substrate, each having the characteristic structure described earlier, wherein the first and third LED substrates each comprises the substrate connectors at predetermined positions on two sides thereof facing each other in the second direction, and the second and the fourth LED substrates each comprises the substrate connector at a predetermined position on one of two sides thereof facing each other in the second direction, the cabinet comprises screwing portions into which the shaft portions of the fixing screws are to be screwed, the first LED substrate is connected to the first control circuit by way of the substrate connector on left side and connected to the second LED substrate by way of the substrate connector on right side and the substrate connector of the second LED substrate, the third LED substrate is connected to the second control circuit by way of the substrate connector on right side and connected to the fourth LED substrate by way of the substrate connector on left side and the substrate connector of the fourth LED substrate, and when the first direction is a plumb line direction, the first, second, third and fourth LED substrates are secured to the cabinet such that the anchoring claws of the cabinet are fitted into the counterbored recesses formed on lower one of two sides facing each other in the first direction, and the fixing screws are screwed into the screwing portions of the cabinet through the holes of the first, second, third and fourth LED substrates.

The structure thus comprising the plurality of LED substrates can still avoid possible cracks due to the thermal expansion of the substrates caused by heat generation by the elements and resulting wiring breakage, and further enables the substrates to be reliably anchored to the cabinet.

Focusing on the prevention of possible warp of the substrate resulting from the thermal expansion, the LED substrate is provided with the elliptical holes, while it is unnecessary for the LED substrate to comprise the counterbored recesses into which the anchoring claws are to be fitted. Below are described thus characteristic structures.

An LED substrate having a rectangular shape on which an LED element is mounted, comprises:

holes through which fixing screws are to be inserted to secure the LED substrate to the cabinet, the fixing screws each having a head portion, an unthreaded neck portion having a diameter smaller than a diameter of the head portion and a threaded shaft portion having a diameter smaller than the diameter of the neck portion; and a substrate connector provided at a predetermined position on one side of the LED substrate or at predetermined positions on two sides of the LED substrate facing each other, the substrate connector connecting the LED substrate to a control circuit for the LED element or another LED substrate, wherein the holes each has an elliptical shape having a major axis larger than the diameter of the head portion and a minor axis smaller than the diameter of the head portion and larger than the diameter of the neck portion, and a thickness of the LED substrate is designed so that a boundary position between the neck portion and the head portion is located at a height position equal to a surface of the LED substrate when the fixing screws are inserted through the holes and fastened.

An LED light source device comprising the LED substrate having the structure described above is an LED light source device formed on the cabinet, comprising: a plurality of the control circuits including a first control circuit and a second control circuit; and at least one first LED substrate, at least one second LED substrate, at least one third LED substrate and at least one fourth LED substrate, each having the characteristic structure described earlier, wherein the first and third LED substrates each comprises the substrate connectors at predetermined positions on two sides thereof facing each other in the second direction, and the second and the fourth LED substrates each comprises the substrate connector at a predetermined position on one of two sides thereof facing each other in the second direction, the cabinet comprises screwing portions into which the shaft portions of the fixing screws are to be screwed, the first LED substrate is connected to the first control circuit by way of the substrate connector on left side and connected to the second LED substrate by way of the substrate connector on right side and the substrate connector of the second LED substrate, the third LED substrate is connected to the second control circuit by way of the substrate connector on right side and connected to the fourth LED substrate by way of the substrate connector on left side and the substrate connector of the fourth LED substrate, and the first, second, third and fourth LED substrates are secured to the cabinet such that the fixing screws are screwed into the screwing portions of the cabinet through the holes of the first, second, third and fourth LED substrates.

To evaluate the structures focusing on improvement of its safety, it is more desirable that the screws and the anchoring claws be both used to anchor the substrates to the cabinet.

According to the LED substrate provided by the present invention, possible warp of the substrate can be prevented from happening despite heat generation by the LED element, and cracks in the substrate and resulting wiring breakage can be successfully avoided. Further, the substrate placed in the cabinet can be more reliably coupled with the cabinet, and manufacturing costs can be controlled.

BRIEF DESCRIPTION OF THE DRAWINGS

FIG. 6 is a schematic illustration of a state where the LED substrate according to the present invention is heated.

FIG. 12 is an illustration of an LED substrate obtained by improving a part of the conventional LED substrate.

DESCRIPTION OF THE PREFERRED EMBODIMENTS

Hereinafter, preferred embodiments of the present invention are described in detail. Any structural components illustrated in FIGS. 1 to 6 below that are identical to those of FIGS. 7 to 13 are simply given the same reference symbols.

Figure 1:
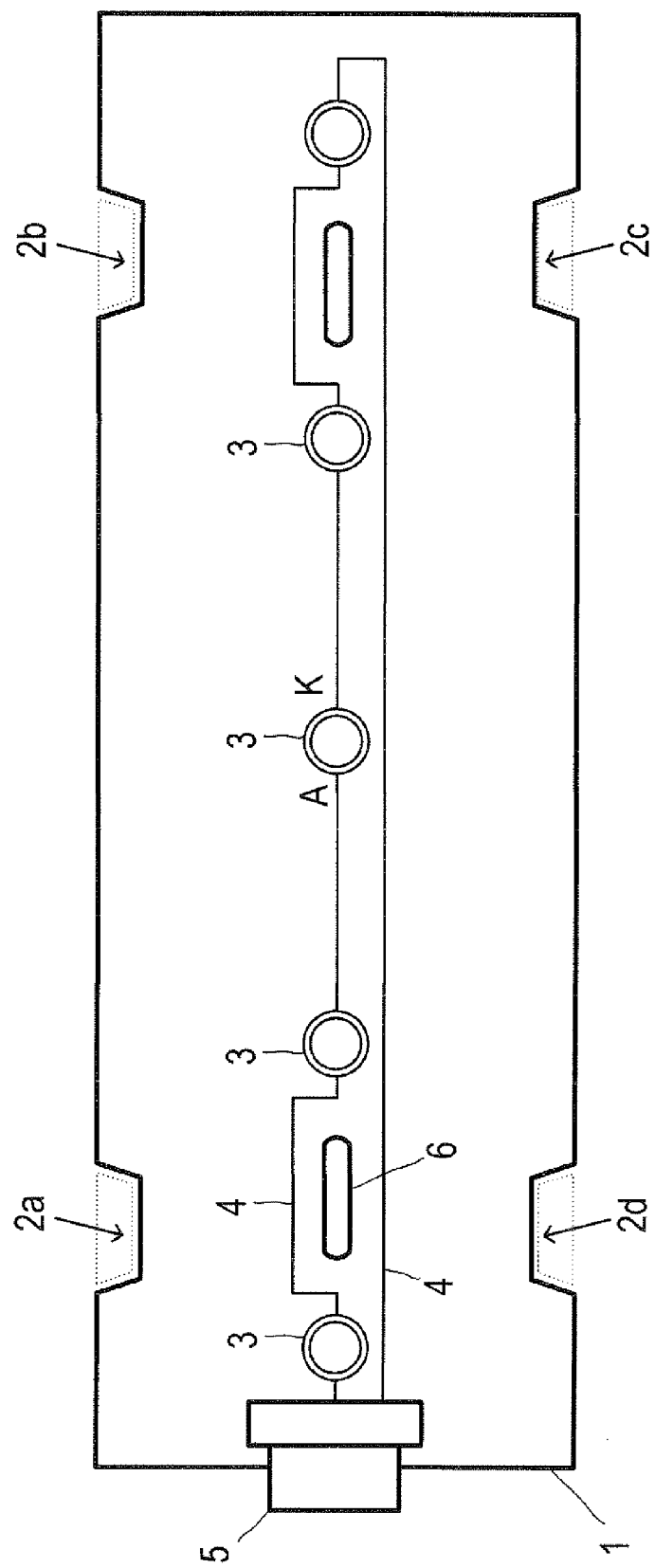
FIG. 1 is an illustration of a structure of an LED substrate according to the present invention.

FIG. 1 is an illustration of a structure of an LED substrate according to the present invention. An LED substrate 1 comprises a plurality of LED elements 3 connected in series to one another by a wiring 4 in a manner similar to FIG. 10, while counterbored recesses are formed on both of a pair of sides facing each other as opposed to FIG. 10. Counterbored recesses 2a and 2b are formed on one of the sides, and counterbored recesses 2c and 2d are formed on the other side. In the description given below, the counterbored recesses 2a, 2b, 2c and 2d are collectively referred to as "counterbored recesses 2".

The structure illustrated in FIG. 1 further comprises holes 6 used when the substrate is placed in the cabinet and securely fastened thereto. Unlike the tapped hole 106 illustrated in FIG. 7, the illustrated hole 6 has an elliptical shape.

Figure 2:
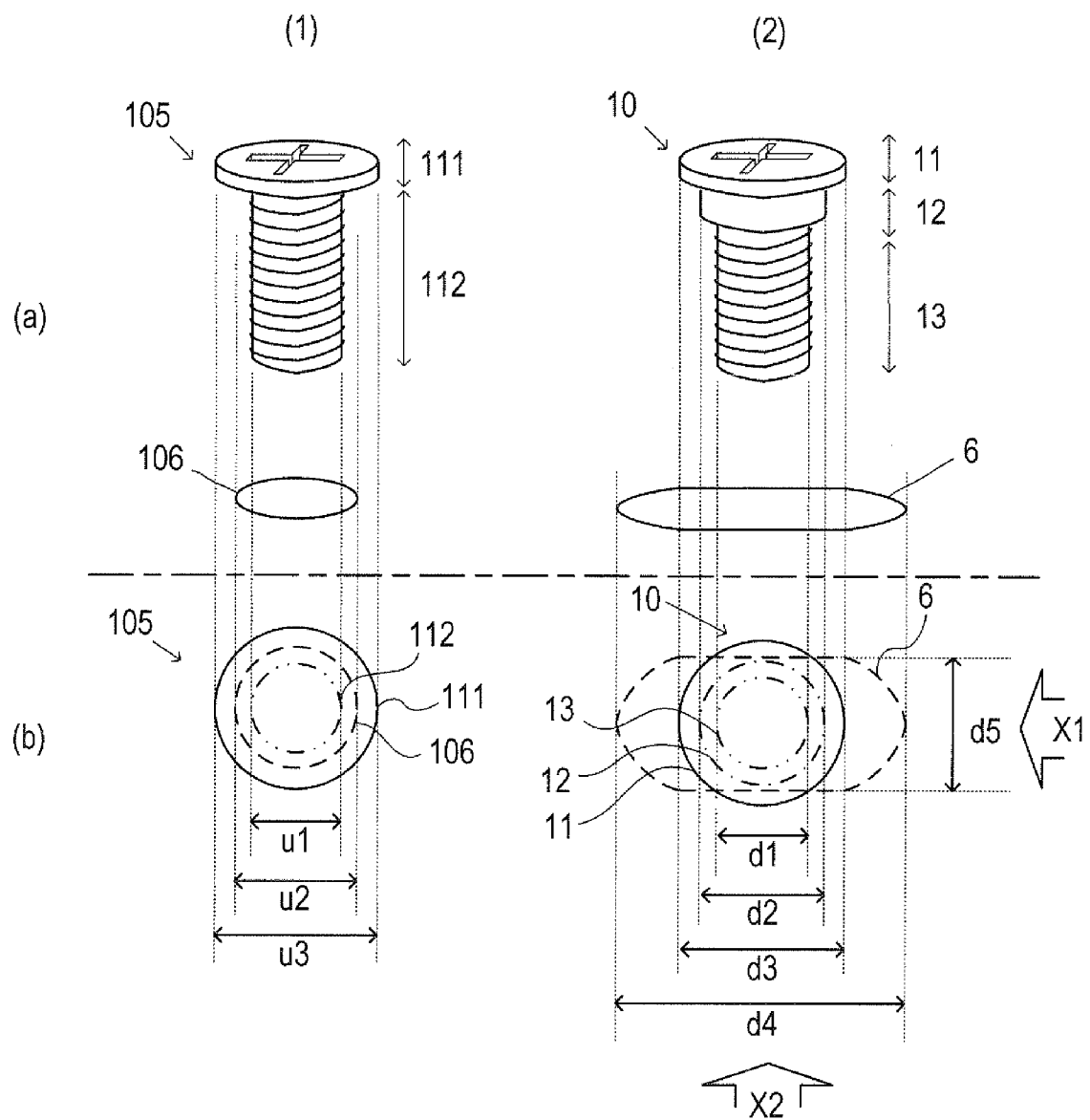
FIG. 2 are illustrations of a hole formed in the LED substrate according to the present invention and a tapped hole formed in a conventional LED substrate for comparison.
Figure 7:
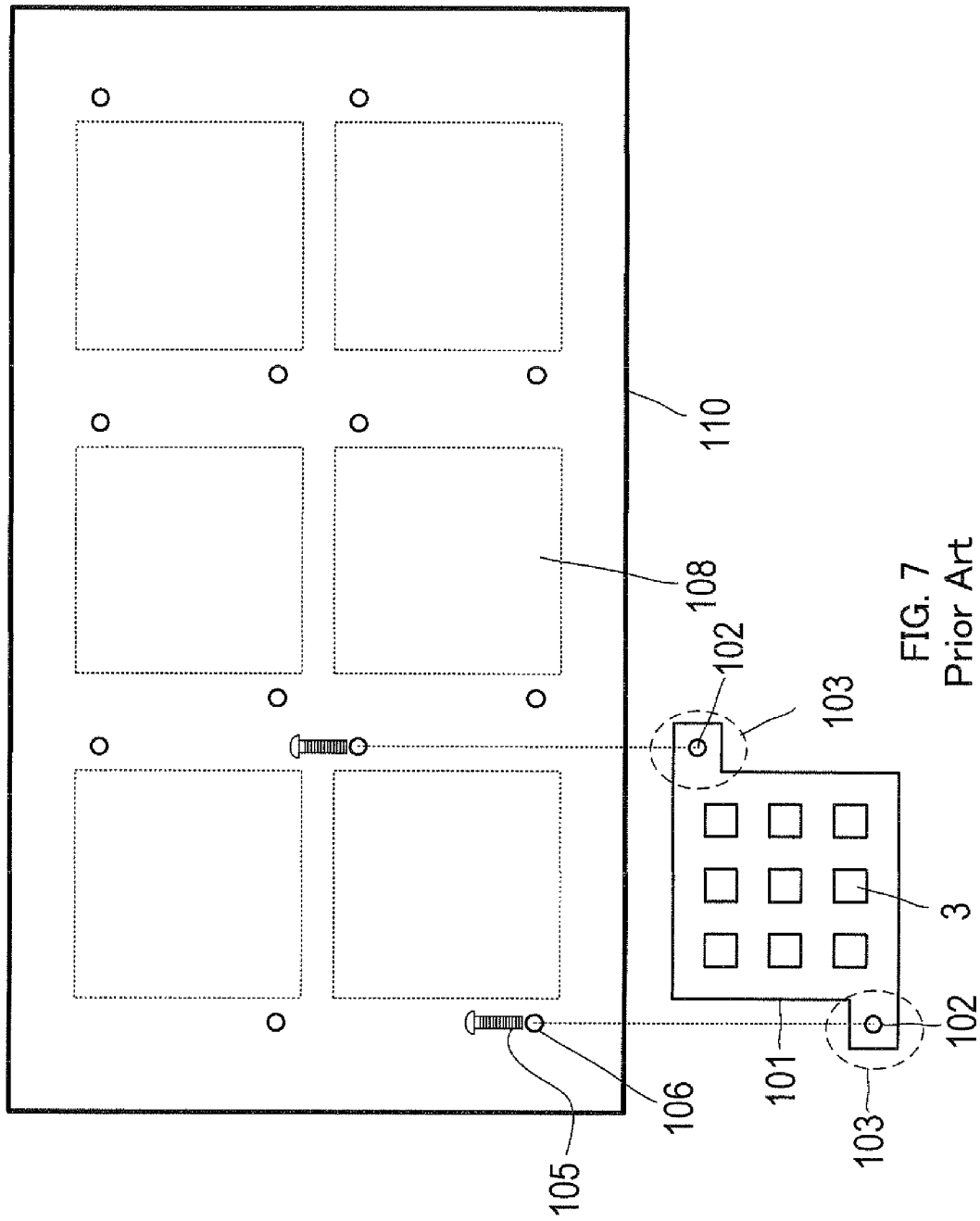
FIG. 7 is an illustration of a conventional LED substrate and method for anchoring the LED substrate.
Figures 8A, 8B:
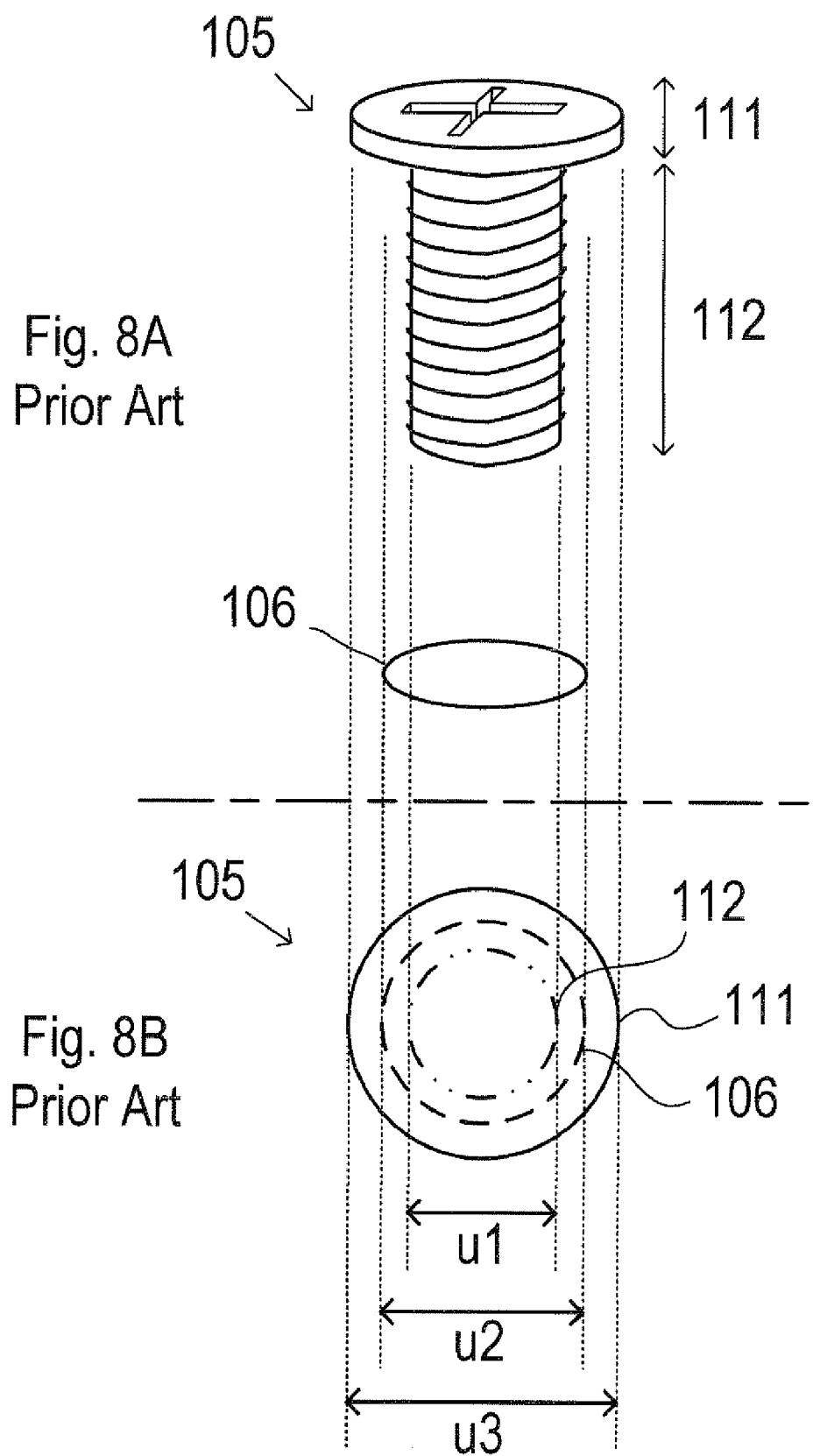
FIG. 8 is a schematic illustration of a screw and a tapped hole for anchoring the conventional LED substrate.

FIG. 2 is an illustration of the fixing screw 105 to be inserted through the tapped hole 106 illustrated in FIG. 7 and a fixing screw 10 to be inserted through the hole 6 illustrated in FIG. 1 for comparison. In FIG. 2(1) corresponding to FIG. 8, the conventional tapped hole 106 of FIG. 7 is illustrated. FIG. 2(2) is a schematic illustration of the hole 6 formed in the LED substrate 1 according to the present invention, the fixing screw 10, and a state where the fixing screw 10 is inserted through the hole 6. In FIG. 2, (a) denotes a perspective drawing, and (b) denotes a planar drawing in top view.

As illustrated in FIG. 2(2)(a), the fixing screw 10 comprises a head portion 11, a neck portion 12 and a shaft portion 13. The shaft portion 13 is threaded, while the head portion 11 and the neck portion 12 are unthreaded.

As with the fixing screw 105 illustrated in FIG. 2(1), the head portion 11, neck portion 12 and shaft portion 13 of the fixing screw 10 illustrated in FIG. 2(2) all have a cylindrical shape. A diameter d3 of the head portion 11, a diameter d2 of the neck portion 12 and a diameter d1 of the shaft portion 13 have a relationship represented by d3>d2>d1.

A major axis d4 of the hole 6 is larger than the diameter d3 of the head portion 11 (d4>d3) as illustrated in FIG. 2(2)(b). A minor axis d5 of the hole 6 is smaller than the diameter d3 of the head portion 11 and larger than the diameter d2 of the neck portion 12 (d3>d5>d2).

Figure 3:
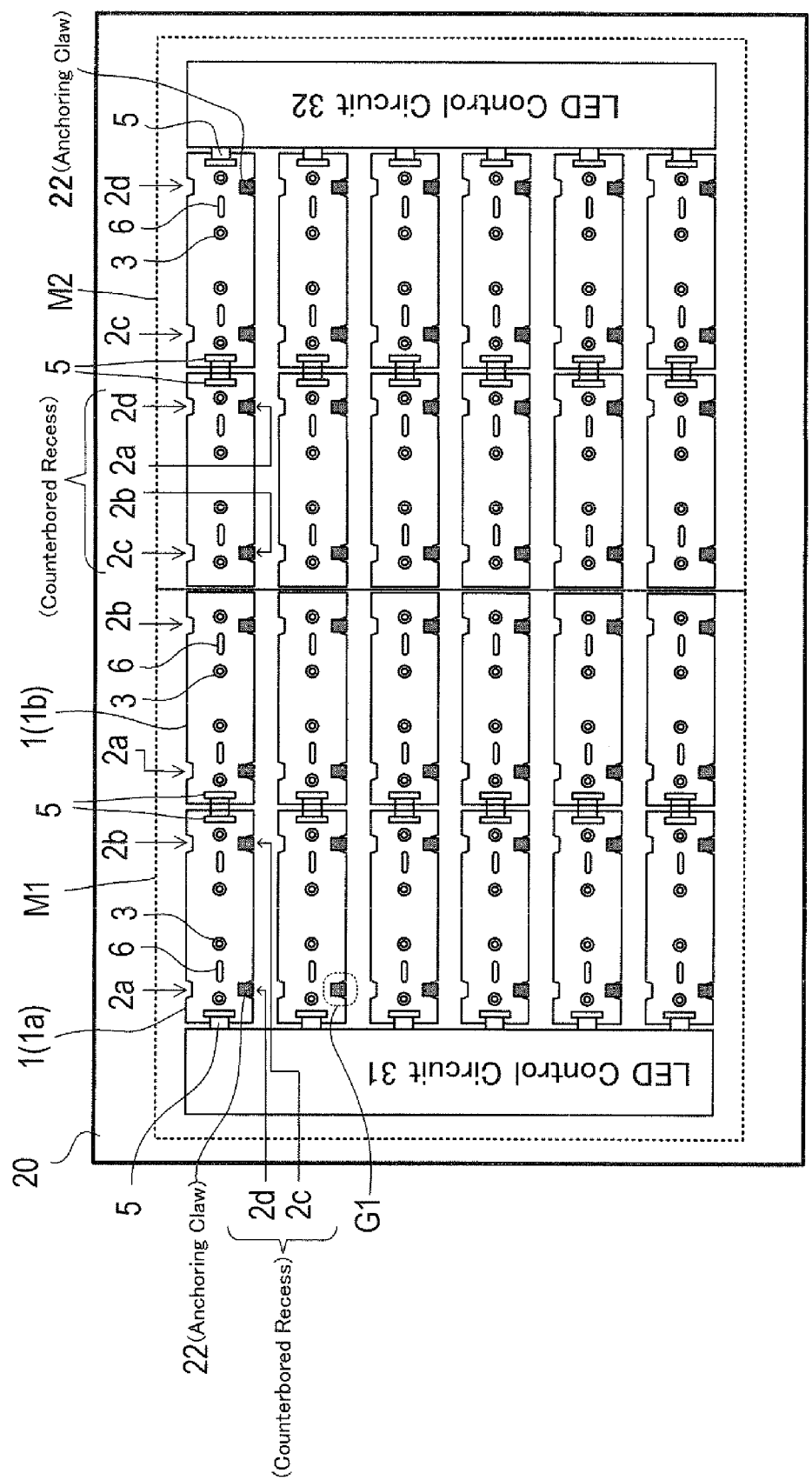
FIG. 3 is an illustration of an LED light source device comprising the LED substrates according to the present invention.

The LED substrate 1 having such a structure placed in a cabinet 20 (LED light source device) is illustrated in FIG. 3. FIG. 3 illustrates a state before the fixing screws 10 are inserted through the holes 6 to avoid an overly complex illustration.

Figure 11:
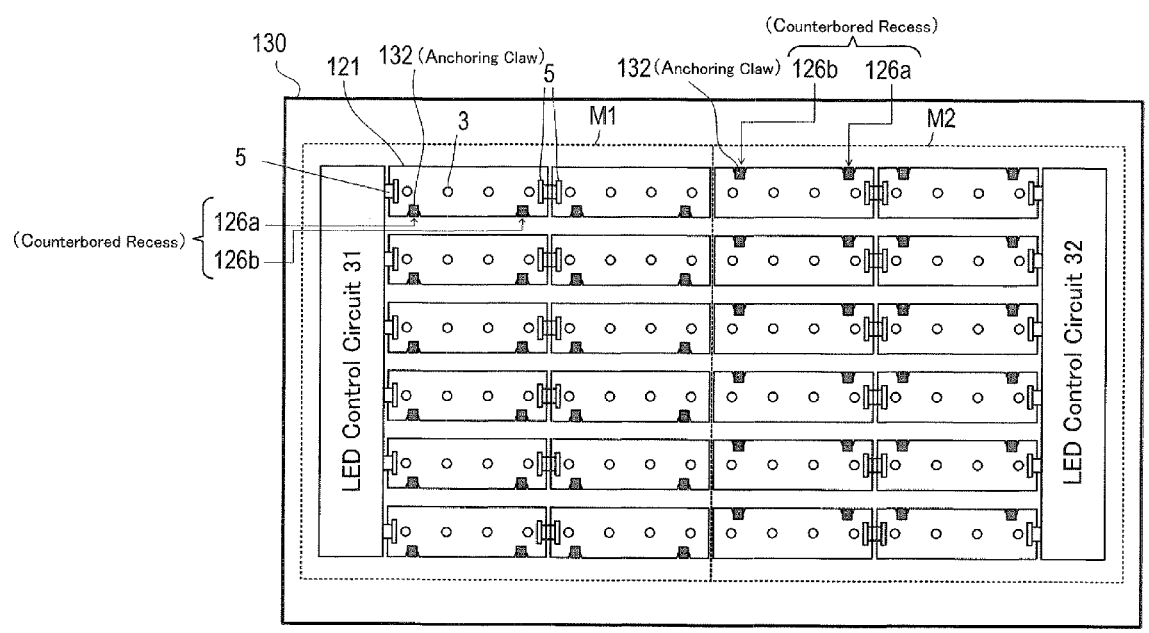
FIG. 11 is an illustration of an LED light source device comprising the conventional LED substrate.
Figure 13:
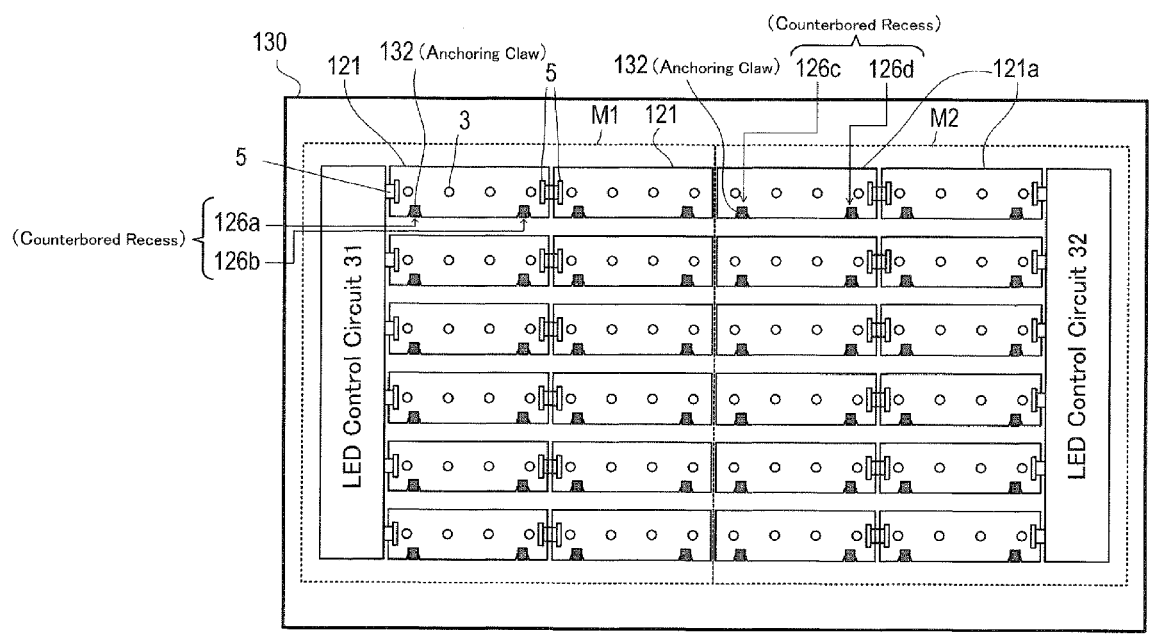
FIG. 13 is an illustration of an LED light source device comprising the improved conventional LED substrate.

In FIG. 3, a plurality of LED substrates 1 are provided in a manner similar to FIG. 11. The LED elements 3 mounted on the LED substrates 1 of an M1 group on left facing the drawing are driven by an LED control circuit 31, while the LED elements 3 mounted on the LED substrates 1 of an M2 group on right facing the drawing are driven by an LED control circuit 32.

The M1 group includes the LED substrates directly coupled with the LED control circuit 31 and the LED substrates uncoupled with the LED control circuit 31 but coupled with the LED substrates adjacent to the LED substrates on left facing the drawing. To simplify the description, the LED substrates 1 directly coupled with the LED control circuit 31 are called "LED substrates 1a", and the LED substrates 1 uncoupled with the LED control circuit 31 but connected to the LED substrates 1a are called "LED substrates 1b". In FIG. 3, these referenced symbols 1a and 1b are used.

The LED substrates 1a are each provided with substrate connectors 5 on both sides thereof on right and left facing the drawing. The LED substrate 1a is coupled with the LED control circuit 31 by way of the substrate connector 5 on left to be electrically connected thereto, and further coupled with the LED substrate 1b by way of the substrate connector 5 on right.

The LED substrates 1b are each provided with a substrate connector 5 on one side thereof on left facing the drawing. The LED substrate 1b is coupled with the substrate connector 5 on the right side of the LED substrate 1a by way of the substrate connector 5.

The LED elements 3 on the LED substrates 1b are also electrically connected to the LED control circuit 31 and can be thereby driven by the LED control circuit 31. When a wiring is routed to enable the electrical connection, the wiring extends from the LED control circuit 31 and passes through a rear surface of the LED substrate 1a to be connected to the substrate connector 5 of the LED substrate 1b, and then connected to the LED elements 3 mounted on the LED substrate 1b by way of the substrate connector 5. These structural components are not necessarily connected in the described manner, and other connection methods can be employed.

In this specification is given no description of the LED substrates 1 in the M2 group having a structure bilaterally symmetrical to the LED substrates in the M1 group.

As illustrated in FIG. 1, the counterbored recesses 2 are formed in the LED substrate 1 according to the present invention on both of a pair of sides facing each other. Thus, the counterbored recesses are provided in the LED substrates 1 of the M2 group on a lower side facing the drawing as well (counterbored recesses 2a and 2b).

The LED substrates 1 of the M1 group can be anchored to the cabinet 20 by inserting the anchoring claws 22 into the counterbored recesses 2c and 2d, and the LED substrates 1 of the M2 group can be anchored to the cabinet 20 by inserting the anchoring claws 22 into the counterbored recesses 2a and 2b. Accordingly, in such a component placement that an upper side facing the drawing is a vertically upward direction and a lower side facing the drawing is a vertically downward direction, the anchoring claws can be inserted into the LED substrates 1 of the both groups through lower sections thereof and further upward.

Therefore, the LED substrates 1 of the M1 and M2 groups can be both supported by the anchoring claws 22 from their lower side through upper side thereof, and can be thereby more firmly coupled with the cabinet 20 than the structure illustrated in FIG. 11.

The hole 6 formed in such a shape as illustrated in FIG. 2(2) can prevent the substrate from warping due to heat generation. Below is given a description to the effect of the particular shape.

FIG. 4 are schematic illustrations of a state where the fixing screw 10 is inserted through the hole 6 and further screwed into the cabinet 20. The cabinet 20 comprises screwing portions into which the fixing screws 10 are to be screwed. The drawing illustrates the state where the shaft portion 13 of the fixing screw 10 is screwed into the screwing portion.

Figure 4A:
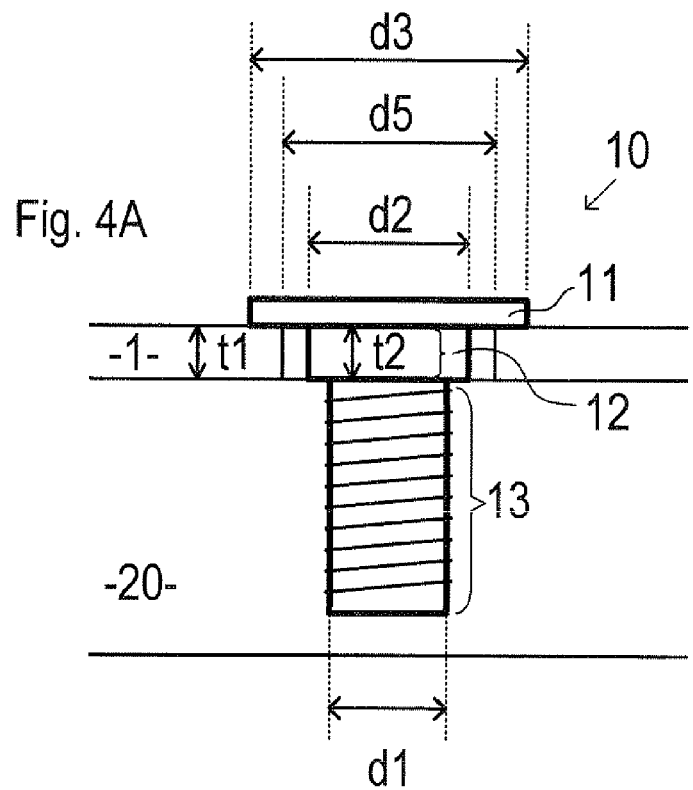
FIG. 4 is a schematic illustration of a state where the LED substrate according to the present invention is anchored to a cabinet by a screw.
Figure 4B:
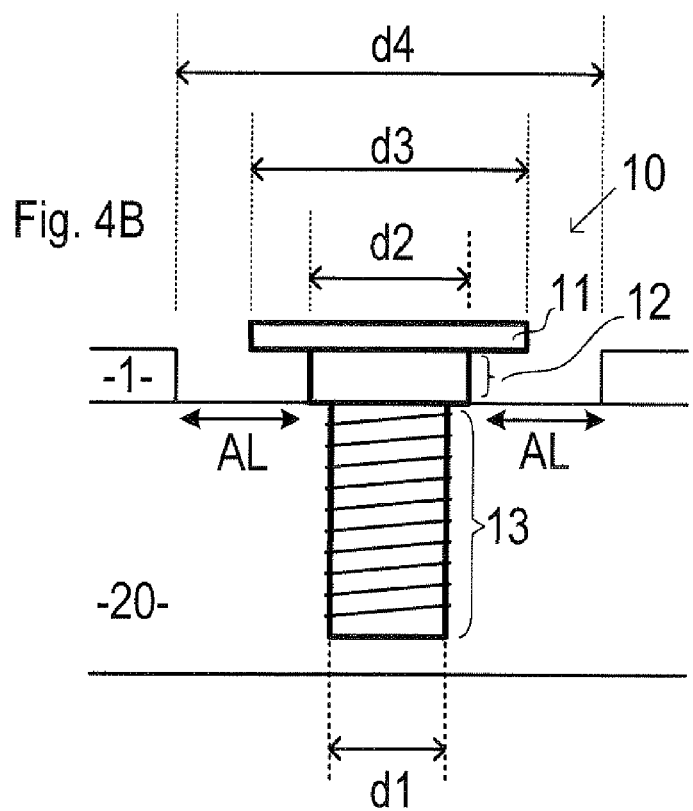

FIG. 4A is a drawing viewed in X1 direction of FIG. 2, and FIG. 4B is a drawing viewed in X2 direction of FIG. 2. The X1 direction is a direction of the major axis of the elliptical hole 6, and the X2 direction is a direction of the minor axis of the hole 6.

When viewed in the X1 direction (major-axis direction), the diameter d3 of the head portion 11 is larger than the minor axis d5 of the hole 6. A thickness t1 of the LED substrate 1 is designed to be smaller than and substantially equal to a height t2 of the neck portion 12. As a result, a boundary plane between the head portion 11 and the neck portion 12 contacts the surface of the LED substrate 1.

When viewed in the X2 direction (minor-axis direction), however, a part of the hole 6 is left unoccupied on both sides of the screw 10 along the major-axis direction when the fixing screw 10 is screwed into the cabinet 20 (AL in FIG. 4B) because the major axis d4 of the hole 6 is larger than the diameter d3 of the head portion 11. The height t2 of the neck portion 12 and the thickness t1 of the LED substrate 1 are substantially equal to each other as described earlier. Therefore, the boundary plane between the neck portion 12 and the shaft portion 13 is located so as to contact the surface of the cabinet 20.

Figure 5:
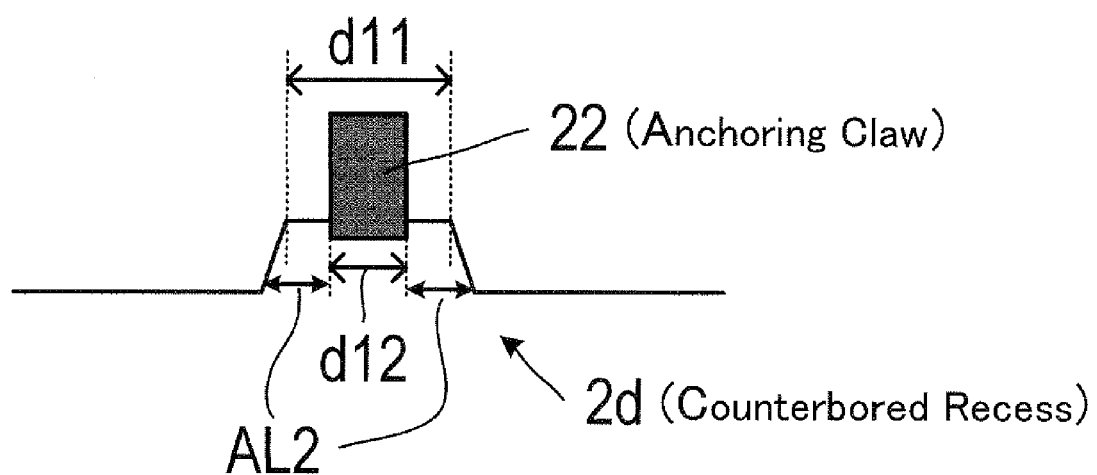
FIG. 5 is a schematic illustration of a positional relationship between a counteredbored recess and an anchoring claw.

FIG. 5 is an enlarged view of a positional relationship between the counterbored recess 2 and the anchoring claw 22, wherein a region G1 illustrated in FIG. 3 is enlarged.

As illustrated in FIG. 5, the counterbored recess 2d is formed so that a width d11 thereof is larger than a width d12 of the anchoring claw 22. This dimensional relationship is not limited to the counterbored recess 2d in G1, and widths of any other counterbored recesses are larger than the width of the anchoring claw 22. The "width" denotes a length in the direction of the major axis of the hole 6.

Figure 9A:
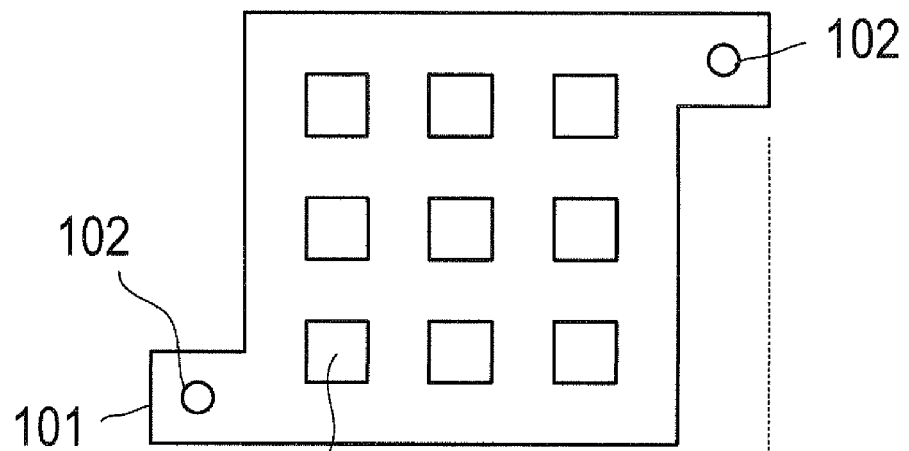
FIG. 9 is a schematic illustration of a state where the conventional LED substrate is heated.
Figure 9B:
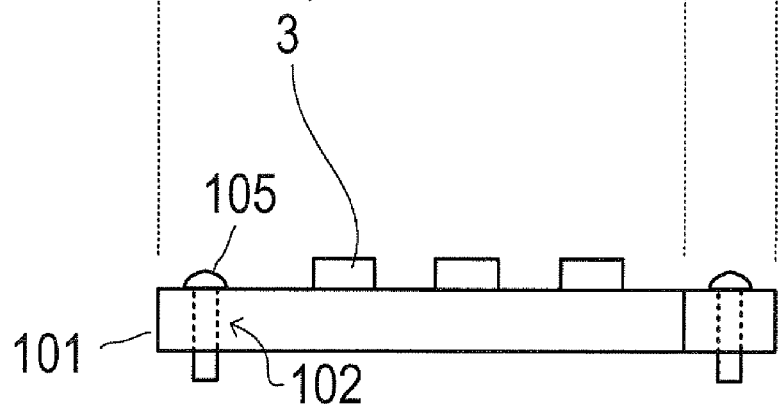
Figure 9C:
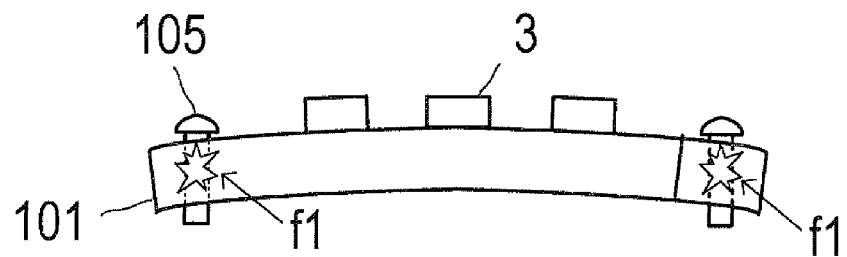
Figure 10:
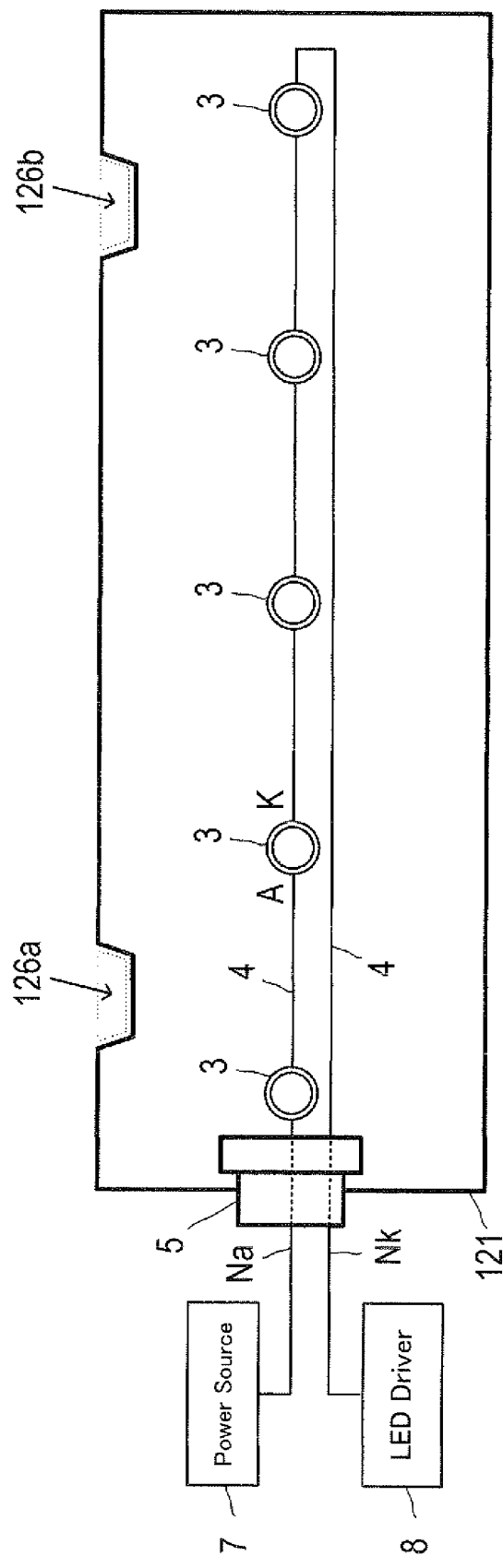
FIG. 10 is an illustration of a structure of the conventional LED substrate.

FIG. 6 illustrates a state where the LED substrate 1 according to the present invention described so far is thermally expanded. As illustrated in FIG. 9, it is likely that heat generation by the LED elements 3 applies heat to the substrate 1, thereby causing thermal expansion of the LED substrate 1. FIG. 6A is a drawing in top view, and FIGS. 6B, C and D are drawings in front view.

FIGS. 6A and B shows a state of the substrate 1 before heated. In the case where the substrate 1 is heated and thereby thermally expanded, sections other than the immovably screw-fastened sections are warped (FIG. 6C) in a manner similar to FIG. 9C.

According to the structure provided by the present invention, a part of the hole 6 is left unused in the direction of its own major axis between the LED substrate 1 and the fixing screw 10 (AL) as illustrated in FIG. 4B. The AL serves as a generally called "play". More specifically, there is the play "AL" in the direction of the major axis of the hole 6 although the screw-fastened sections are immovable in the LED substrate 1, therefore, the substrate 1, even after thermally expanded, is still allowed to move in the major-axis direction.

As illustrated in FIG. 5, the relationship between the anchoring claw 22 and the counterbored recess 2 is also given an allowance AL2 in the direction of the major axis of the hole 6.

Therefore, the substrate 1, once warped as illustrated in FIG. 6C, is enabled to move by the allowance (play) in the direction of the major axis of the hole 6, and the movement can relieve the substrate of the warp (FIG. 6D). This eliminates the possibility that an intensive stress is applied to vicinity of the screw-fastened sections. As a result, such unfavorable events as possible cracks in the LED substrate 1 and resulting breakage of the wiring 4 can be avoided as compared with the conventional structures.

The head portion 11 and the neck portion 12 of the fixing screw 10 are unthreaded as illustrated in FIGS. 2-2 and 4. Therefore, only a small friction is generated on the contact surfaces of the head portion 11 and the LED substrate 1 and the contact surfaces of the neck portion 12 and the cabinet 20. As a result, the substrate 1, even after thermally expanded, can still move smoothly in the direction of the major axis of the hole 6.

The LED substrate 1 can be more effectively relieved of the warp by forming the hole 6 so that the major axis thereof is along the longitudinal direction of the LED substrate 1 as illustrated in FIG. 1.

According to the structure provided by the present invention, the anchoring claw 22 and the fixing screw 10 are both used to anchor the LED substrate 1 to the cabinet 20, which improves the stability.

Further, manufacturing costs can be controlled because it is unnecessary to separately produce different substrates solely for fitting the anchoring claws into the counterbored recesses in one direction irrespective of the positional relationship with the LED control circuit as described referring to FIG. 12.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. An LED substrate having a rectangular shape on which an LED element is mounted, comprising:
    counterbored recesses into which anchoring claws provided in a cabinet for supporting the LED substrate are to be fitted, the counterbored recesses being formed at predetermined positions on two sides of the LED substrate facing each other in a first direction;
    holes through which fixing screws are to be inserted to secure the LED substrate to the cabinet, the fixing screws each having a head portion, an unthreaded neck portion having a diameter smaller than a diameter of the head portion and a threaded shaft portion having a diameter smaller than the diameter of the neck portion; and
    a substrate connector provided at a predetermined position on at least one of two sides of the LED substrate in a second direction orthogonal to the first direction, the substrate connector connecting the LED substrate to a control circuit for the LED element or another LED substrate, wherein
    the holes each has an elliptical shape having a major axis larger than the diameter of the head portion and a minor axis smaller than the diameter of the head portion and larger than the diameter of the neck portion,
    widths of the counterbored recesses in a direction of the major axis of the holes are larger than those of the anchoring claws, and
    a thickness of the LED substrate is designed so that a boundary position between the neck portion and the head portion is located at a height position equal to a surface of the LED substrate when the fixing screws are inserted through the holes and fastened.

2. An LED light source device formed on a cabinet, comprising:
    a plurality of control circuits including a first control circuit and a second control circuit; and
    at least one first LED substrate, at least one second LED substrate, at least one third LED substrate and at least one fourth LED substrate, each being the LED substrate according to claim 1, wherein
    the first and third LED substrates each comprises the substrate connectors at predetermined positions on two sides thereof facing each other in the second direction, and the second and the fourth LED substrates each comprises the substrate connector at a predetermined position on one of two sides thereof facing each other in the second direction,
    the cabinet comprises screwing portions into which shaft portions of fixing screws are to be screwed,
    the first LED substrate is connected to the first control circuit by way of the substrate connector on left side and connected to the second LED substrate by way of the substrate connector on right side and the substrate connector of the second LED substrate,
    the third LED substrate is connected to the second control circuit by way of the substrate connector on right side and connected to the fourth LED substrate by way of the substrate connector on left side and the substrate connector of the fourth LED substrate, and
    when the first direction is a plumb line direction, the first, second, third and fourth LED substrates are secured to the cabinet such that anchoring claws of the cabinet are fitted into the counterbored recesses formed on lower one of two sides facing each other in the first direction, and the fixing screws are screwed into the screwing portions of the cabinet through the holes of the first, second, third and fourth LED substrates.

3. An LED substrate having a rectangular shape on which an LED element is mounted, comprising:
   holes through which fixing screws are to be inserted to secure the LED substrate to a cabinet, the fixing screws each having a head portion, an unthreaded neck portion having a diameter smaller than a diameter of the head portion and a threaded shaft portion having a diameter smaller than the diameter of the neck portion; and
   a substrate connector provided at a predetermined position on one side of the LED substrate or at predetermined positions on two sides of the LED substrate facing each other, the substrate connector connecting the LED substrate to a control circuit for the LED element or another LED substrate, wherein
   the holes each has an elliptical shape having a major axis larger than the diameter of the head portion and a minor axis smaller than the diameter of the head portion and larger than the diameter of the neck portion, and
   a thickness of the LED substrate is designed so that a boundary position between the neck portion and the head portion is located at a height position equal to a surface of the LED substrate when the fixing screws are inserted through the holes and fastened.

4. An LED light source device formed on the cabinet, comprising:
   a plurality of control circuits including a first control circuit and a second control circuit; and
   at least one first LED substrate, at least one second LED substrate, at least one third LED substrate and at least one fourth LED substrate, each being the LED substrate according to claim 3, wherein
   the first and third LED substrates each comprises the substrate connectors at predetermined positions on two sides thereof facing each other in the second direction, and the second and the fourth LED substrates each comprises the substrate connector at a predetermined position on one of two sides thereof facing each other in the second direction,
   the cabinet comprises screwing portions into which shaft portions of fixing screws are to be screwed,
   the first LED substrate is connected to the first control circuit by way of the substrate connector on left side and connected to the second LED substrate by way of the substrate connector on right side and the substrate connector of the second LED substrate,
   the third LED substrate is connected to the second control circuit by way of the substrate connector on right side and connected to the fourth LED substrate by way of the substrate connector on left side and the substrate connector of the fourth LED substrate, and
   the first, second, third and fourth LED substrates are secured to the cabinet such that the fixing screws are screwed into the screwing portions of the cabinet through the holes of the first, second, third and fourth LED substrates.

* * * * *